United States Patent [19]

Siuta et al.

[11] Patent Number: 4,521,329

[45] Date of Patent: Jun. 4, 1985

[54] COPPER CONDUCTOR COMPOSITIONS

[75] Inventors: Vincent P. Siuta, Cherry Hill, N.J.; Joel Slutsky, Williamsville, N.Y.

[73] Assignee: E. I. Du Pont de Nemours and Company, Wilmington, Del.

[21] Appl. No.: 505,730

[22] Filed: Jun. 20, 1983

[51] Int. Cl.³ ............................................. H01B 1/02
[52] U.S. Cl. ................................... 252/512; 252/518; 252/514; 106/1.13; 106/1.14
[58] Field of Search ........................ 252/512, 518, 514; 106/1.13, 1.18, 1.14, 1.19

[56] References Cited

U.S. PATENT DOCUMENTS

| | | | |
|---|---|---|---|
| 2,993,815 | 7/1961 | Treptow | 117/212 |
| 3,647,532 | 3/1972 | Friedman et al. | 117/212 |
| 3,988,647 | 10/1976 | Bolon et al. | 317/101 B |
| 4,070,518 | 1/1978 | Hoffman | 428/209 |
| 4,072,771 | 2/1978 | Grier, Sr. | 427/96 |
| 4,172,919 | 10/1979 | Mitchell | 428/209 |

FOREIGN PATENT DOCUMENTS 0068167  3/1982  European Pat. Off. .

OTHER PUBLICATIONS

Handbook of Materials and Processes for Electronics, C. A. Harper, ed., McGraw-Hill, (1970), Chapter 12, pp. 12-1-12-82.

*Primary Examiner*—Josephine L. Barr

[57] ABSTRACT

Thick film conductor compositions comprising finely divided particles of copper oxide-coated copper and low softening point inorganic binder dispersed in a low-resin organic medium. Additional copper oxide is incorporated into the composition by either direct addition or by inclusion in the inorganic binder.

7 Claims, No Drawings

COPPER CONDUCTOR COMPOSITIONS

FIELD OF THE INVENTION

The invention is directed to thick film conductor compositions and particularly to copper-containing conductor compositions.

BACKGROUND OF THE INVENTION

Thick film conductors are widely used as a means of interconnecting various passive and active devices for hybrid microcircuits and resistor networks. Utility as a general purpose conductor requires certain performance attributes such as conductivity, solderability, solder leach resistance, compatibility with other circuit components, and ability to be processed under a wide range of conditions. Inherent in the usefulness of thick film conductors is the cost of materials in the composition. It is extremely advantageous to reduce the cost without significantly changing the performance characteristics.

Thick film conductors are comprised of conductive metal and inorganic binder, both of which are in finely divided form and are dispersed in an organic medium. The conductive metal is ordinarily gold, palladium, silver, platinum or mixtures and alloys thereof, the choice of which depends upon the particular combination of performance characteristics which are sought, e.g., resistivity, solderability, solder leach resistance, migration resistance, adhesion and the like.

Thick film techniques are contrasted with thin film techniques which involve deposition of particles by vacuum evaporation or sputtering. Thick film techniques are discussed in *Handbook of Materials and Processes for Electronics*, C. A. Harper, Editor, McGraw-Hill, N.Y., 1970, Chapter 12.

In the current economic climate in which noble metals have experienced substantial fluctuations in price, it is especially attractive from a business viewpoint to substitute less expensive base metals as the conductive metal in thick film conductor compositions.

Several base metals have been proposed and used with mixed success as the conductive phase for thick film conductors, among which the most important is copper. However, because of the reactivity of copper metal when it is heated in air, copper-containing thick film conductors are commonly fired in a nonoxidizing atmosphere such as nitrogen. Firing has generally been conducted at 850°–1050° C., a temperature of 900°–1050° C. being preferred. Moreover, it has usually been necessary that any associated functional layer of resistor or dielectric materials also be fired in a nonoxidizing atmosphere to avoid oxidation of the copper-containing layer.

One very important potential application of copper-containing conductors is for the termination of thick film resistors which are usually prepared from ruthenium oxide-based materials such as $RuO_2$ and ruthenium-containing pyrochlore materials. However, to obtain optimum performance characteristics, such ruthenium-based resistors must be fired in air. When they are fired in nitrogen, currently available ruthenium-based resistor systems frequently do not exhibit good electrical properties. Therefore, it would be advantageous to use dual atmosphere firing in which the ruthenium-based resistor compositions are fired first in air and the copper terminations and conductors are then applied and fired in a nonoxidizing atmosphere such as nitrogen. This technique would facilitate the combination of the excellent electrical characteristics of ruthenium-based resistors with the low cost of copper conductors.

PRIOR ART

Copper-containing thick film conductor compositions are, of course, well known in the art. They have, in fact, been formulated in a number of different ways for a wide variety of applications. For example, U.S. Pat. No. 2,993,815 to Treptow is directed to a method of forming a copper conductive layer for printed circuits on a refractory substrate by screen printing a layer of 5–50 parts by weight copper or copper oxide and 1 part by weight of reduction-resistant glass frit dispersed in an organic medium. The conductive layer is formed by firing the applied paste in two stages at 500°–1050° C. In the first firing stage, the glass is partially sintered in an oxidizing atmosphere and in the second stage, the glass is completely sintered in a reducing atmosphere. On the other hand, U.S. Pat. No. 3,647,532 to Friedman is directed to conductive inks for use on ceramic substrates comprising copper and glass frit dispersed in an organic polymeric binder using a lead borosilicate glass binder containing cadmium oxide. Firing is carried out in a nonoxidizing atmosphere at 820°–850° C.

Bolon et al., U.S. Pat. No. 3,988,647, disclose a conductor composition comprising Cu particles which have been treated to remove oxide from the surface dispersed in a solventless polymeric binder. This patent is concerned only with oxide-free Cu powders and the conductive composition of this reference contains quite high polymer concentrations.

U.S. Pat. No. 4,070,518 to Hoffman is directed to a conductor composition, especially for use on dielectric substrates, comprising 85–97% wt. Cu powder and 3–15% wt. of Cd- and Bi-free lead aluminoborate glass frit dispersed in an organic medium which may contain ethyl cellulose. This patent is silent with respect to any oxide coating on the copper particles or the relationship of total oxide in the composition to the amount of copper. The patent is also silent with respect to any details of the organic medium used therewith.

The Grier patent, U.S. Pat. No. 4,072,771 is directed to a conductor composition comprising Cu particles which have been preoxidized to form a surface layer of CuO and glass frit dispersed in 15–25% wt. organic medium. The oxide coating of the Cu particles constitutes 1–5% by wt. of the total solids (Cu, oxide and glass). The patent is silent with respect to the addition of CuO by means other than the oxide coating and it fails to recognize any importance to the composition of the organic medium used therewith.

U.S. Pat. No. 4,172,919 to Mitchell is directed to a conductor composition comprising 86–97% wt. Cu powder, 1–7% wt. CuO and 1–7% wt. of a glass frit containing at least 75% wt. $Bi_2O_3$ dispersed in 10–30% wt. inert organic medium. The patent is silent with respect to the importance of any oxide coating on the copper particles as well as any relationship of total oxide to the amount of copper. As with the other patents mentioned above, this patent teaches only generalities concerning the organic medium.

In EPO application No. 0068167 to McCormick et al., a conductor composition is disclosed comprising 65–80 pbw Cu powder, 0–6 pbw CuO and 3–8 pbw of a Bi-free low melting glass dispersed in an organic medium containing 20–40% wt. methacrylate resin dissolved in volatile solvent. The application is silent with respect to the importance of any oxide coating on the copper particles as well as any relationship between the total oxides and the amount of copper. The organic medium in this patent contains a quite high amount of polymer as well.

None of the foregoing disclosures recognizes the suitability of including CuO as a component of the glass frit.

BRIEF DESCRIPTION OF THE INVENTION

In its primary aspect, the invention is directed to a printable thick film conductor composition comprising an admixture of finely divided particles of:

(a) metallic copper containing at least 0.2% by weight oxygen as a copper oxide coating, the particles having a size range of 0.5–10 μm average particle size of 1–5 μm and a surface-to-weight ratio of less than 1 m²/g;

(b) copper oxide having a size range of 0.1–10 μm and average particle size of 0.5–5 μm, the weight ratio of copper oxide particles to oxide-coated copper metal particles being from 0 to 0.15;

(c) an inorganic binder having a softening point of 300°–700° C., a size range of 1–10 μm and average particle size of 1–5 μm, the weight ratio of copper oxide in the binder to copper oxide on the copper metal particles being from 0 to 0.5, all dispersed in (d) an organic medium containing not more than 1.0% by weight resin, basis total composition, the total amount of copper oxide from (a), (b) and (c) being 4–15% by weight of the oxide-coated copper metal in (a).

In a second aspect, the invention is directed to a conductor element comprising a ceramic substrate having a patterned film of the above-described conductor composition which has been fired to effect volatilization of the organic medium, decomposition of the copper oxide and sintering of the inorganic binder and copper.

In a still further aspect, the invention is directed to a method of making a terminated resistor comprising the sequential steps of:

(1) applying to a ceramic substrate (including porcelain enamel-coated metal substrates) a layer of thick film resistor paste comprising an admixture of finely divided particles of resistance material and inorganic binder dispersed in organic medium;

(2) firing the layer of resistor paste in an oxidizing atmosphere to effect volatilization of the organic medium and sintering of the inorganic binder;

(3) applying to the fired resistor layer a patterned layer of the above-described conductor composition; and (4) firing the patterned conductor layer in a nonoxidizing atmosphere to effect volatilization of the organic medium, decomposition of the copper oxide and sintering of the inorganic binder and copper.

DETAILED DESCRIPTION OF THE INVENTION

A. Conductive Phase

Both the composition and configuration of the copper particles which can be used in the composition of the invention are very important.

In particular, because the presence of certain impurities in the copper decreases electrical conductivity and interferes with sintering of the copper and the inorganic binder, it is essential as a practical matter that the copper, exclusive of the oxide layer thereon, be at least about 99.5% pure on a weight basis and preferably even higher. This is especially important because, with the composition of the invention, it is necessary to obtain sintering of the copper particles at a quite low firing temperature (400°–700° C.), which is almost 50% below the melting point of the copper (1083° C.). A firing temperature of 500°–700° C. is preferred.

With respect to particle configuration, both particle size and particle shape are very important.

To attain suitable sintering properties, it is essential that the copper particles have a particle size of 0.5–10 μm and an average particle size of 1–5 μm. When the copper particles are less than about 1 μm, the surface area of the particle becomes too high, which necessitates the use of excessive amounts of organic medium to obtain suitable printing viscosities. Moreover, it is very difficult to burn out high amounts of organic medium. On the other hand, when the size of the copper particle is more than about 10 μm, the particles do not sinter adequately at low firing temperatures and therefore the conductor layer does not adhere adequately to either the ceramic substrate or the resistor layer. Such coarse particles also incur poor printing characteristics. For these same reasons it is also necessary that, within these broad limits of acceptable particle size, the average particle size should be 1–5 μm. An average copper particle size of 2–4 μm is preferred to attain even better properties in the fired film.

It is also essential that the copper particles used in the invention have a substantial degree of sphericity. That is, they must have a surface area-to-weight ratio of below about 1.0 m²/g. A ratio of 0.8 m²/g or lower is preferred and 0.2–0.5 m²/g is an especially preferred practical minimum range. The minimum possible surface-to-weight ratio for 2 μm size particles would be about 0.30 m²/g for perfect spheres. For 4 μm size spherical particles, the minimum possible surface area-to-weight ratio would be about 0.15 m²/g. However, as a practical matter, such perfect spheres are not obtainable.

In addition to the foregoing compositional and configurational criteria, it is essential that the copper particles be at least partially coated with a layer of copper oxide. While it is preferred that the copper oxide coating constitute at least 2% copper oxide by weight of the coated copper particles, it is still further preferred that the amount of copper oxide coating be even higher, e.g., 4–10% by weight. However, it is essential that the oxide coating not exceed about 15% by weight of the oxide coated particle. Above about 15% by weight oxide, the terminations made therewith become more difficult to solder and tend to dewet upon repeated immersion in molten solder.

It is well known that clean metal surfaces have a high surface energy which results in a strong gradient toward a lower energy state. Such surfaces easily adsorb gases such as oxygen which react chemically with strongly electropositive metal atoms to form a strongly bonded oxide layer on the surface (see Pask, *Glass-Metal "Interfaces" and Bonding,* U. of California, Lawrence Radiation Laboratory, Berkeley, Calif., Report UCRL 10611, 1963). By virtue of this mechanism, most metal surfaces which have been cleaned contain a layer of oxide. Furthermore, more reactive metals such as copper will normally have a substantial oxide coating in the absence of special treatment to avoid such oxidation. Thus, most copper powders will possess an oxide coating without the necessity of further treatment. For example, most available finely divided copper metal has an oxide coating which constitutes 2-3% by weight of the particle. However, if it is desired to increase the oxide coating, this can be done by agitating and heating the particles in air. On the other hand spherical particles of even higher oxide content can be made by atomizing the copper in air or an atmosphere containing a controlled amount of oxygen. It is preferred that the copper have at least 1% by weight oxide and many commercially-available copper powders have on the order of 2-3% copper oxide on the surface of the particles.

Because of the more intimate contact between the oxide and the organic medium when the oxide is on the copper particles, it is preferred that most, and preferably all, of the copper oxide which is needed in the composition of the invention be derived from the coating on the dispersed copper particles. The remainder of the oxide needed for the composition, if any, can be supplied by the addition of particles of copper oxide to the composition and/or by the inclusion of copper oxide in the inorganic binder. Any additional oxide can be provided by either method or by both. However, as indicated above, the total copper oxide in the composition must not exceed about 15% by weight of the oxide coated copper particles.

From the foregoing, it can be seen that it is necessary to control the total amount of oxygen as copper oxide in the formulation, i.e., the amount of copper oxide in the copper powder must be considered in addition to the amount added as copper oxide or the amount added in the glass binder. In general it has been observed that the amount of oxygen as copper oxide from all sources (oxide coating on the copper powder, and $Cu_2O$ and CuO added separately or to the glass frit) must be at least about 1.0% weight of the total copper in order to get good substrate adhesion, but not more than about 2.0% weight in order to maintain good solderability.

Copper powders of high purity and low oxygen content (<0.3% wt. oxygen) yield copper conductors having zero adhesion. This is attributed to incomplete burn-out of the vehicle due to insufficient oxygen in the formulation. Calculations show that about 0.5% wt. oxygen is required to burn out the vehicle in a typical copper conductor composition if all the oxygen is assumed to come from copper oxide in the formulation and none from the furnace atmosphere.

With an increase in oxygen content up to 1.0% wt., adhesion increases to near maximum levels and solderability is also found to be excellent. Film adhesion increases gradually as the oxygen content in the copper powder increases from 1.0 to 1.5% wt. oxygen, with a small decrease in solderability. In the range between 1.5% and 2.0% wt. oxygen, adhesion remains at near maximum values, but solderability is noticeably degraded.

From this observed dependence of adhesion and solderability on oxygen content, it is apparent that about 1.0-2.0 and preferably 1.0-1.5% wt. oxygen in the copper powder is required for optimum adhesion and solderability. Furthermore, it has been found that the adhesion of low oxygen copper powders can be increased by additions of copper oxide. Therefore, additions of $Cu_2O$ or CuO to the formulation give approximately equivalent results to copper oxide present as a surface oxide layer on the copper powder. In both cases, about 1.0 to 2.0% by weight oxygen or its equivalent as $Cu_2O$ or CuO is required in order to obtain good adhesion and solderability. The following may therefore be taken to be equivalent in terms of oxygen content:

1.0% wt. O (in Cu powder)=8.94% wt.
$Cu_2O$=4.97% wt. CuO.

The amount of $Cu_2O$ or CuO to be added may be calculated from the following equations:

% wt. $Cu_2O$ = 8.94 (1-% wt. O in Cu powder)

% wt. CuO = 4.97 (1-% wt. O in Cu powder).

Following are the calculations required to prepare a copper conductor formulation having good adhesion and solderability from a copper powder having 0.2% wt. oxygen (as copper oxides). The formulation contains a total of 86.54% wt. copper plus copper oxides. If additional oxygen is added as $Cu_2O$, the amount required is calculated to be:

% wt. $Cu_2O$ = 8.94 (1-0.2)=7.15% wt.

Therefore, the amount of copper powder (with 0.2% wt. oxygen) will be:

% wt. Cu powder=86.54 - % wt. $Cu_2O$

% wt. Cu powder=86.54−7.15=79.39% wt.

The advantage of the invention can still be obtained when the conductor phase contains other conductive materials so long as these other materials are inert and do not interfere with the copper oxide decomposition and the sintering of the copper and the inorganic binder during firing. Thus in special cases, if desired, the copper can be admixed with other base metals or even with noble metals. In theory, even major amounts of noble metals can be used in conjunction with the copper/copper oxide conductive phase. However, it is obvious that the economic advantages of the invention are reduced accordingly. Moreover, it is preferred that the addition of such metals be minimized lest the added metal particles interfere with the interactions among the copper, copper oxide and inorganic binder and thereby degrade the properties of the fired thick film.

Silver is a preferred noble metal for use with copper in the compositions of the invention. From 1-50% wt. silver, basis total copper content, and preferably 5-20% wt. silver can ordinarily be used. However, eutectic proportions of silver relative to the copper can also be used. The Ag/Cu eutectic is 72% wt. Ag/28% wt. Cu.

B. Inorganic Binder

Glasses and other inorganic binders used in conductors perform several functions. The primary function of binders is to provide chemical or mechanical bonding to the substrate. They also may facilitate sintering of the metal film by means of liquid phase sintering when the glassy binder wets the conductor surface. It is preferred that the glass binder have a softening point below 600° C. in order that the glass have adequate flow properties. This is needed for adhesion to the substrate and, for the low-firing compositions of the invention, a softening point of about 300°-500° C. is preferred.

Although the chemical composition of the binder system is not critical to the functionality of these thick film conductor compositions, the inorganic binder should melt or flow at a sufficiently low temperature to aid sintering of the metal particles during firing.

The inorganic binder is preferably a low-softening point, low viscosity glass at a level of 1–20 parts by weight and, preferably, at 5–15 parts by weight. As used herein, the term low-softening point glass is one having a softening point 100° C. below the intended peak firing temperature as measured by the fiber elongation method (ASTM - C338-57). The glass utilized in this invention must also have a low viscosity at the firing temperature to aid liquid phase sintering of inorganic particulates. A glass having a specific viscosity (log $\eta$ of less than 6) at the firing temperature which will aid liquid phase sintering is preferred. Lead borosilicate glasses and bismuth oxide-containing glasses are particularly preferred inorganic binders.

Lead borosilicate glasses have been used extensively in the invention and found to be excellent from the viewpoint of low softening point and good adhesion to the substrate. However, in order to assure good hermeticity and moisture resistance, it is preferred to use low borate glasses, that is, those containing below about 20% by weight $B_2O_3$ or its equivalent. Both reducing- and nonreducing-type glasses are operable.

The amount of inorganic binder will ordinarily be from 1 to 20% by weight of the solids (excluding organic medium) and preferably 5 to 10% by weight.

As mentioned above, it may in some instances be desirable to incorporate into the glass a small amount of copper oxide to augment the oxide on the copper particles and/or the added copper oxide particles. The amount of copper oxide in the glass must therefore be chosen so that the resulting formulated composition contains no more than about 15% by weight of the copper oxide, basis weight of the oxide coated copper particles.

The glasses are prepared by conventional glassmaking techniques, by mixing the desired components in the desired proportions and heating the mixture to form a melt. As is well known in the art, heating is conducted to a peak temperature and for a time such that the melt becomes entirely liquid and homogeneous. In the present work the components are premixed by shaking in a polyethylene jar with plastic balls and then melted in a platinum crucible at 800°–1000° C. The melt is heated at the peak temperature for a period of 1–1½ hours. The melt is then poured into cold water. The maximum temperature of the water during quenching is kept as low as possible by increasing the volume of water to melt ratio. The crude frit, after separation from water, is freed from residual water by drying in air or by displacing the water by rinsing with methanol. The crude frit is then milled for 3–5 hours in alumina containers using alumina grinding media. Alumina picked up by the materials, if any, is not within the observable limit as measured by X-ray diffraction analysis.

After discharging the milled frit slurry from the mill, the excess solvent is removed by decantation and the frit powder is air-dried at room temperature. The dried powder is then screened through a 325 mesh screen to remove any large particles.

Two major properties of the frit are (1) it aids the liquid phase sintering of the inorganic crystalline particulate matter and (2) it forms a bond to the substrate.

C. Organic Medium

The inorganic particles are mixed with an organic liquid medium (vehicle) by mechanical mixing to form a paste-like composition having suitable consistency and rheology for screen printing. The latter is printed as a "thick film" on conventional dielectric substrates in the conventional manner.

Any inert liquid may be used in the vehicle so long as it volatilizes out cleanly upon drying and firing. Various organic liquids, with or without thickening and/or stabilizing agents and/or other common additives, may be used as the vehicle. Exemplary of organic liquids which can be used are the aliphatic alcohols, esters of such alcohols, for example, acetates and propionates, terpenes such as pine oil, terpineols and the like, solutions of resins such as the polymethacrylates of lower alcohols, and solutions of ethyl cellulose in solvents such as pine oil, and the monobutyl ether of ethylene glycol monoacetate. A preferred vehicle is based on ethyl cellulose and 2,2,4-trimethyl pentanediol-1,3-monoisobutyrate. The vehicle may contain volatile liquids to promote fast drying after application to the substrate.

Even though a wide variety of inert liquids can be used in the organic medium, it has nevertheless been found that, unlike conventional thick film compositions, the organic polymer content of the organic medium for use in the invention must be maintained within quite narrow limits. In particular it has been found that the content of such polymeric materials as ethyl cellulose and methacrylate resins must be maintained at a level no higher than 1.0% by weight of the solids content of the dispersion. A polymer level no higher than 0.5% by weight is preferred, especially when nonacrylic polymers such as ethyl cellulose are used in the organic medium. Somewhat higher polymer levels in the organic medium can be tolerated if the nitrogen-firing atmosphere contains several ppm oxygen in the burnout zone of the furnace.

In theory it would be desirable to have no resin at all in the organic medium. However, as a practical matter, the organic medium must contain at least about 1 to 3% by weight resin in order to obtain suitable rheological properties in the dispersion so that it can be applied satisfactorily by screen printing.

The ratio of vehicle to solids in the dispersion can vary considerably and depends upon the manner in which the dispersion is to be applied and the kind of vehicle used. Normally to achieve good coverage the dispersions will contain complementally 70–90% solids and 30–10% vehicle.

In formulating the compositions of the invention, it is preferred to minimize the amount of organic medium and also, as indicated above, to minimize the amount of high molecular weight materials in the organic medium. The reason for this in both instances is to provide for complete volatilization of the organic medium. The amount of oxygen available for volatilization of the organic medium by oxidation is, of course, quite limited because of the necessity of firing the copper in a nonoxidizing atmosphere. Therefore, in the formulation of the composition, the rheology is adjusted to obtain desired printing viscosity with the least possible amount of organic medium. Thus, both to decrease the viscosity as well as to enhance the volatilization of the organic medium, it is also preferred to limit the amount of resin in the organic medium to a level of 10% by weight or below, which corresponds to less than 1.0% by weight of the total formulation. The compositions of the present invention may, of course, be modified by the addition of other materials which do not affect its beneficial characteristics. Such formulation is well within the skill of the art.

The viscosity of the pastes for screen printing is typically within the following ranges when measured on a Brookfield HBT viscometer at low, moderate and high shear rates:

| Shear Rate (Sec$^{-1}$) | Viscosity (Pa · S) | |
| --- | --- | --- |
| 0.2 | 100–5000 | — |
| | 300–2000 | Preferred |
| | 600–1500 | Most preferred |
| 4 | 40–400 | — |
| | 100–250 | Preferred |
| | 140–200 | Most preferred |
| 384* | 7–40 | — |
| | 10–25 | Preferred |
| | 12–18 | Most preferred |

*Measured on HBT Cone and Plate Model Brookfield Viscometer.

The amount of vehicle utilized is determined by the final desired formulation viscosity.

Formulation and Application

In the preparation of the composition of the present invention, the particulate inorganic solids are mixed with the organic carrier and dispersed with suitable equipment to form a suspension, resulting in a composition for which the viscosity will be in the range of about 100–250 Pa.S at a shear rate of 4 sec$^{-1}$.

In the examples which follow, the formulation was carried out in the following manner:

The ingredients of the paste, minus about 5% organic components equivalent to about 0.5% wt. of the formulation, are weighed together in a container. The components are then vigorously mixed to form a uniform blend; then the blend is passed through dispersing equipment to achieve a good dispersion of particles. A Hegman gauge is used to determine the state of dispersion of the particles in the paste. This instrument consists of a channel in a block of steel that is 25 $\mu$m deep on one end and ramps up to 0 depth at the other end. A blade is used to draw down paste along the length of the channel. Scratches will appear in the channel where the diameter of the agglomerates is greater than the channel depth. A satisfactory dispersion will give a fourth scratch point of 10–15 $\mu$m typically. The point at which half of the channel is uncovered with a well dispersed paste is between 3 and 8 $\mu$m typically. Fourth scratch measurement of >20 $\mu$m and "half-channel" measurements of >10 $\mu$m indicate a poorly dispersed suspension.

The remaining 5% consisting of organic components of the paste is then added, and the content of organic medium is adjusted to bring the viscosity when fully formulated to between 140 and 200 Pa.S at a shear rate of 4 sec$^{-1}$.

The composition is then applied to a substrate, such as alumina ceramic, usually by the process of screen printing, to a wet thickness of about 25–80 microns, preferably 25–60 microns and most preferably 25–35 microns. The conductor compositions of this invention can be printed onto the substrate either by using an automatic printer or a hand printer in the conventional manner. Preferably automatic screen stencil techniques are employed using 200 to 325 mesh screens. The printed pattern is then dried at below 200° C., e.g., 120°–150° C., for about 5–15 minutes before firing. Firing to effect sintering of both the inorganic binder and the finely divided copper particles is preferably done in a belt conveyor furnace under a nitrogen atmosphere with a temperature profile that will allow burnout of the organic matter at about 300° C. and densification of the thick film on heating to 600° C. This is followed by a controlled cooldown cycle to prevent over-sintering, unwanted chemical reactions at intermediate temperatures, or substrate fracture which can occur from too rapid cooldown. The overall firing procedure will preferably extend over a period of about 1 hour, with 20–25 minutes to reach the peak firing temperature, about 10 minutes at the firing temperature, and about 20–25 minutes in cooldown. In some instances, total cycle times as short as 30 minutes can be used.

In the fabrication of resistors using the compositions of the invention, the resistor layer is applied to the substrate (usually 96% by weight alumina) in the appropriate pattern and fired in an oxidizing atmosphere. Then the conductor compositions of the invention are applied in the appropriate pattern and fired in a nonoxidizing atmosphere at a temperature low enough to avoid extensive reduction of the resistance material and interaction of the copper metal. In this manner the copper-containing conductors are not exposed to the rigors of an oxidizing atmosphere at the high firing temperature.

Test Procedures

Adhesion:

The adhesion was measured using an "Instron" pull tester in a 90° peel configuration at a pull rate of 2 inches per minute. Twenty gauge pre-tinned wires were attached to 80 mil × 80 mil pads by solder dipping for 10 seconds in 62 Sn/36 Pb/2 Ag solder at 220° C. or in 63 Sn/37 Pb solder at 230° C. using Alpha 611 flux. Aging studies were carried out in a Blue M Stabil-Therm ® oven controlled at 150° C. After aging, test parts were allowed to equilibrate several hours in air before the wires were pulled.

Solderability:

The solderability tests were performed as follows: The fired parts were dipped in a mildly active rosin flux such as Alpha 611, then heated for 2–4 seconds by dipping the edge of the ceramic chip in the molten solder. The chip was then submerged in the solder for 10 seconds, withdrawn, cleaned, and inspected. Solderability was determined visually by observation of the percent of solder coverage on the fired copper-containing thick film. Alpha 611 is a tradename for solder flux made by Alpha Metals, Inc. Jersey City, N.J.

The invention will be better understood by reference to the following examples.

EXAMPLES

Examples 1–6

A series of four thick film conductive compositions was prepared, utilizing copper as the primary conductive constituent, which contained various total amounts of copper oxide derived from the oxide coating on the copper particles and from addition of $Cu_2O$. Two different copper powders were used having the following properties:

| Designation Properties | A | B |
| --- | --- | --- |
| % wt below 10 μm size | 99.9 | 99.9 |
| Average particle size, μm | 2.2 | 4.0 |
| Surface area, m²/g | 0.3 | 0.25 |
| Tap density, g/cc | 4.5 | 4.8 |
| % wt O in coating | 1.0 | 0.1 |

The inorganic binder used in each of the examples had the following composition and properties:

| Designation Composition | A % wt. |
| --- | --- |
| PbO | 68.4 |
| CdO | 9.3 |
| SiO₂ | 9.3 |
| B₂O₃ | 13.0 |
| | 100.0 |
| Properties Softening point, °C. | 455 |

The organic medium used in each of the examples had the following composition:

| Designation Composition | A % wt. |
| --- | --- |
| Dibutyl Carbitol | 28.5 |
| Dibutyl phthalate | 51.5 |
| Tridecyl phosphate | 1.3 |
| 2,6-ditert.-butyl-4-methyl-phenol | 2.1 |
| Ethyl cellulose | 5.2 |
| β-terpineol | 11.4 |
| | 100.0 |

Each of the compositions of the series was formulated in the manner described above and used to formulate a thick film conductor also in the manner described hereinabove. Each of the fired conductors was tested with respect to adhesion, solderability and conductivity properties. The composition of the four thick film conductive compositions and the properties of the conductors made therefrom are given in Table 1 below:

TABLE 1

| Effect of Copper Oxide Content on Conductor Properties | | | | |
| --- | --- | --- | --- | --- |
| Example No. | 1 | 2 | 3 | 4 |
| Composition | | % wt. | | |
| Cu Powder A | 86.5 | — | — | 77.0 |
| B | — | 86.5 | 79.0 | — |
| Cu₂O | — | — | 7.5 | 9.5 |
| Inorganic Binder | 5.7 | 5.7 | 5.7 | 5.5 |
| Organic medium | 7.8 | 7.8 | 7.8 | 8.0 |
| | 100.0 | 100.0 | 100.0 | 100.0 |
| Total oxygen as copper oxide, wt. % | 0.9 | 0.1 | 0.9 | 1.8 |
| Conductor Properties | | | | |
| Adhesion | high | poor | high | high |
| Solderability | good | good | good | poor |
| Conductivity | good | good | good | fair |

The data from Examples 1 and 2 show that too little oxygen as oxide on the powder is detrimental to adhesion. However, Example 3 shows that the needed amount of oxygen can be provided by addition of Cu₂O as well as by a coating of oxide on the copper particles. Example 4, however, shows that too much oxide can be detrimental to solderability and conductivity, even though it gives quite good adhesion From this, it can be seen that the composition of the invention should contain not more than 2.0% by weight oxygen as copper oxide and 0.5–1.5% weight is preferred.

Examples 5 and 6

A further series of two conductors was formulated and tested in the same manner as Example 1 in which two different compositions of cadmium-free inorganic binder were used. The binders had the following composition and properties:

| Designation Composition | B | C |
| --- | --- | --- |
| | % wt. | |
| PbO | 78.1 | 80.6 |
| B₂O₃ | 12.4 | 12.0 |
| SiO₂ | 5.4 | 6.0 |
| Al₂O₃ | 4.1 | — |
| ZnO | — | 1.4 |
| | 100.0 | 100.0 |
| Properties Softening point, °C. | 443 | 430 |

The composition of the thick film compos ion and the properties of the conductors therefrom are given in Table 2 below:

TABLE 2

| Effect of Frit Composition on Conductor Properties | | |
| --- | --- | --- |
| Example No. | 5 | 6 |
| Composition | % wt. | |
| Cu Powder A | 86.5 | 86.5 |
| B | — | — |
| Cu₂O | — | — |
| Inorganic Binders B | 5.7 | — |
| C | — | 5.7 |
| Organic medium | 7.8 | 7.8 |
| | 100.0 | 100.0 |
| Total oxygen as copper oxide, wt. % | 0.9 | 0.9 |
| Conductor Properties | | |
| Adhesion | high | high |
| Solderability | good | good |
| Conductivity | good | good |

The compositions of Examples 5 and 6 gave similarly good conductive properties as those of Examples 1 and 4. Thus, so long as its softening point is within the range of 300°–700° C. to provide adequate flow at the firing temperature, the composition of lead borosilicate-type binders does not appear to be critical.

Examples 7–10

A further series of thick film conductive compositions was formulated in which the amount of polymeric material in the formulation was varied from 0.2% by weight to 1.2% by weight by adjusting the amount of organic medium. The organic medium consisted of 10% by weight ethyl cellulose dissolved in 90% by weight solvent (2,2,4-trimethylpentanediol-1,3-monoisobutyrate). Except for the different organic medium and the use of silver in the conductive phase, the compositions were the same as for Example 1, i.e., they used copper powder A and inorganic binder A. The composition of the thick film compositions and the properties of the conductors therefrom are given in Table 3 below. In the solderability test, a decrease in the number rating denotes improved solderability.

TABLE 3
Effect of Polymeric Content on Conductor Properties

| Example No. | 7 | 8 | 9 | 10 |
|---|---|---|---|---|
| Composition | | % wt. | | |
| Cu Powder A | 77.7 | 73.9 | 72.7 | 72.5 |
| Ag Powder* | 6.4 | 6.1 | 6.0 | 6.0 |
| Inorganic Binder A | 5.6 | 5.3 | 5.2 | 5.2 |
| Organic medium | 10.3 | 14.7 | 16.1 | 16.3 |
| Total oxygen as copper oxide, % wt. | 0.8 | 0.7 | 0.7 | 0.7 |
| Total polymer content, % wt. | 0.2 | 0.7 | 1.0 | 1.2 |
| Conductor Properties | | | | |
| Adhesion (Newtons) | | | | |
| Initial | 29 | 30 | — | 25 |
| Aged | 22 | 13 | — | <2 |
| Solderability | 4 | 3 | 2 | 1 |

*Surface Area 1–1.7 m²/g.

The data in Table 3 show that above about 0.5% weight polymer, aged adhesion is drastically reduced, despite the fact that solderability is improved.

Examples 11–13

A still further series of thick film conductive compositions was formulated in which the amount of polymeric material in the formulation was varied from 0.56 to 0.84% by weight by adjusting the amount of organic medium, which had the following composition:

| | |
|---|---|
| Ethyl cellulose | 7% wt. |
| 2,2,4-trimethylpentanediol-1,3-monoisobutyrate | 61 |
| Dibutyl phthalate | 31 |
| Tridecyl phosphate | 1 |
| | 100.0 |

Again, except for the different organic medium and the silver content of the conductive phase, the compositions were the same as Example 1, the compositions of the thick film compositions and the properties of the conductors therefrom are given in Table 4 below.

TABLE 4
Effect of Polymeric Content on Conductor Properties

| Example No. | 11 | 12 | 13 |
|---|---|---|---|
| Composition | | % wt. | |
| Cu Powder A | 74.8 | 73.4 | 71.7 |
| Ag Powder* | 6.2 | 6.1 | 5.9 |
| Inorganic Binder | | | |
| A | 5.4 | 5.3 | 5.1 |
| B | — | — | — |
| Organic medium | 13.6 | 15.2 | 17.3 |
| Total oxygen as copper oxide, % wt. | 0.8 | 0.7 | 0.7 |
| Total polymer content | 0.6 | 0.7 | 0.8 |
| Conductor Properties | | | |
| Aged Adhesion (Newtons) | 25 | 18 | 16 |

*Surface Area 1–1.7 m²/g

Examples 14 and 15

In these examples, two copper-containing thick film compositions were formulated in which a portion of the desired CuO content was incorporated as a component of the inorganic binder. The copper powder conductive phase and the inorganic binder had the following properties:

| | |
|---|---|
| Cu Powder C | |
| Below 10 μm particle size % wt. | 99.9 |
| Average particle size, μm | 3.0 |
| Surface area, m²/g | 0.3 |
| Oxygen in surface coating, % wt. | 0.4 |
| Inorganic Binder D | |
| B₂O₃, % wt | 46.7 |
| CuO, % wt. | 53.3 |
| | 100.0 |

The CuO-containing glass frit had a softening point of about 650° C. From the above described copper powder and glass frit, two thick film compositions suitable for screen printing were prepared in the manner described hereinabove. Both of the formulations were screen printed onto a 96% wt. alumina substrate, fired and tested as to adhesion, solderability and conductivity. The composition of the thick film material and the property of the conductive layers prepared therefrom were as follows:

TABLE 5
Effect of CuO Addition to Inorganic Binder

| Example No. | 14 | 15 |
|---|---|---|
| Composition | | % wt. |
| Cu Powder C | 86.5 | 86.2 |
| Inorganic Binders C | — | 3.0 |
| D | 5.7 | 3.0 |
| Organic medium | 7.8 | 7.8 |
| Total oxygen as copper oxide, % wt. | 1.0 | 0.7 |
| Total Polymer Content, % wt. | 0.8 | 0.8 |
| Peak Firing Temperature, °C. | 900 | 600 |
| Conductor Properties | | |
| Adhesion | high | high |
| Solderability | good | good |
| Conductivity | good | good |

The high softening point of the CuO-containing frit (Inorganic Binder D), when used as the sole binder in Example 14, required firing of this composition at 900° C. in order to obtain adequate flow of the binder and bonding of the substrate. However, as shown in Example 15, the use of a mixture of equal parts inorganic binders C and D permitted firing at 600° C. with the development of excellent adhesion, solderability and conductivity in the copper film.

The above data show that CuO added to the glass frit is effective in a similar manner as CuO added in particulate form to the composition of the invention.

We claim:

1. A printable thick film conductor composition comprising an admixture of finely divided particles of:
   (a) metallic copper having an oxide coating which contains at least 0.2% by weight oxygen as a copper oxide coating, the particles having a size range of 0.5–10 μm, average particle size of 1–5 μm and a surface-to-weight ratio of less than 1 m²/g;
   (b) copper oxide having a size range of 0.1–10 μm and average particle size of 0.5–5 μm, the weight ratio of copper oxide particles to oxide-coated copper metal particles being from 0 to 0.15;

(c) an inorganic binder having a softening point of 300°–700° C., a size range of 1–15 μm, the weight ratio of copper oxide in the binder to copper metal particles being from 0 to 0.5, all dispersed in (d) an organic medium containing not more than 1.0% wt. resin, basis total composition, the total oxygen content of the copper oxides of (a), (b) and (c) being sufficient to provide 1–2% by weight oxygen, basis copper, and the weight ratio of oxygen added as copper oxide in (b) and (c) to copper oxide on the copper metal particles is from 0.2 to 0.5.

2. The composition of claim 1 in which the total copper oxide content from (a), (b) and (c) is 4–10% by weight.

3. The composition of claim 1 in which the dispersed solids are 70–90% and the organic medium is 30–10% by weight of the total composition.

4. The composition of claim 1 in which the inorganic binder is a lead borosilicate glass.

5. The composition of claim 4 in which the glass contains less than 20% wt. $B_2O_3$.

6. The composition of claim 1 containing 1–50% wt. basis copper of finely divided particles of silver metal.

7. The composition of claim 1 containing eutectic proportions of copper and silver particles.

* * * * *